(12) United States Patent
Henriksen

(10) Patent No.: US 8,958,576 B2
(45) Date of Patent: Feb. 17, 2015

(54) DYNAMICALLY BIASED AMPLIFIER

(75) Inventor: Jens Jørgen Gaarde Henriksen, Charlottenlund (DK)

(73) Assignee: Invensense, Inc., San Jose, CA (US)

( * ) Notice: Subject to any disclaimer, the term of this patent is extended or adjusted under 35 U.S.C. 154(b) by 893 days.

(21) Appl. No.: 13/130,911

(22) PCT Filed: Nov. 24, 2009

(86) PCT No.: PCT/EP2009/065699
§ 371 (c)(1),
(2), (4) Date: Aug. 9, 2011

(87) PCT Pub. No.: WO2010/060892
PCT Pub. Date: Jun. 3, 2010

(65) Prior Publication Data
US 2011/0293115 A1    Dec. 1, 2011

Related U.S. Application Data

(60) Provisional application No. 61/117,646, filed on Nov. 25, 2008.

(51) Int. Cl.
  H03F 3/04    (2006.01)
  H03F 1/30    (2006.01)
(52) U.S. Cl.
  CPC ...................................... H03F 1/301 (2013.01)
  USPC ............................ 381/120; 381/111; 330/296
(58) Field of Classification Search
  None
  See application file for complete search history.

(56) References Cited

U.S. PATENT DOCUMENTS

| 3,582,807 | A | * | 6/1971 | Addis | .......................... 330/145 |
| 6,175,279 | B1 | | 1/2001 | Ciccarelli et al. | |
| 6,188,283 | B1 | | 2/2001 | Hagio et al. | |

FOREIGN PATENT DOCUMENTS

| GB | 2393052 A | 3/2004 |
| JP | 04-290761 | 10/1992 |
| JP | 05-145349 | 6/1993 |
| JP | 2006-262265 | 9/2006 |

OTHER PUBLICATIONS

Larson et al., "Energy Constrained RF Transceivers for Mobile Wireless Communications," IEEE Wireless Communications and Networking Conference, Sep. 1999, vol. 1, pp. 197-200.
European Patent Office, International Search Report for international application No. PCT/EP2009/065699, Mar. 17, 2010.

* cited by examiner

*Primary Examiner* — Joseph Saunders, Jr.
(74) *Attorney, Agent, or Firm* — Maryann Imam; IPxLaw Group LLP

(57) ABSTRACT

An amplifier including an input stage, an output stage, an adjustable bias current generator and a level detector. The input stage may receive and amplify or buffer an input signal. The input stage may be biased by a first bias current. The output stage may supply an output signal to an amplifier load. The output stage may be biased with a second bias current. The adjustable bias current generator may be operatively coupled to the input stage and the output stage to supply these with the first and second bias currents, respectively. The level detector may be operatively coupled to the input signal and the adjustable bias current generator to control the first and second bias currents depending upon the input signal. The adjustable bias current generator may adjust the respective levels of first and second bias currents in opposite directions. Disclosed is an electroacoustical transducer incorporating the amplifier.

13 Claims, 3 Drawing Sheets

DYNAMICALLY BIASED AMPLIFIER

RELATED APPLICATIONS

This application is a 35 U.S.C. §371 National Phase of International Application No. PCT/EP2009/065699 filed on Nov. 24, 2009, which claims priority to U.S. Provisional Application No. 61/117,646 filed on Nov. 25, 2008, the disclosure of which is herein incorporated by reference in its entirety.

The present invention relates to an amplifier comprising an input stage and an output stage with a dynamic biasing arrangement wherein respective levels of DC bias currents supplied to the input stage and the output stage are adjusted in opposite directions.

BACKGROUND OF THE INVENTION

Amplifiers for amplifying voltage or current signals are used in a diverse range of applications ranging from subsonic frequencies to a GHz range for advanced wireless communications systems. Transducer amplifiers are one important type of amplifier where it is required to detect, amplify and otherwise process electrical signals representative of a physical quantity or variable such as sound pressure, acceleration, temperature, pressure, etc. Transducer amplifiers are used in miniature microphones and speakers for mobile terminals and other portable communication devices such as mobile phones, headsets and hearings instruments. Portable devices are typically operated on rechargeable batteries and comprise a large number of power-consuming electronic components. This makes it of the outmost importance to lower power consumption of the transducer amplifier to the lowest possible level compatible with stated or given performance requirements. In many situations there may be a fixed amount of available power, or a power budget, for the transducer amplifier.

The above-mentioned performance requirements typically impose certain constraints on the amount of power or current that a specific transducer amplifier requires. For example, a requirement for a certain input noise voltage leads to a minimum bias current requirement for an input stage of the transducer amplifier once circuit topology and semiconductor technology have been chosen. Likewise, a requirement for a certain load handling capability of an output stage of the transducer amplifier leads to a minimum bias current requirement for an output stage of the transducer amplifier once circuit topology, for example class A, AB or B, and semiconductor technology have been chosen.

However, in accordance with the present invention a level of DC bias current supplied to the input stage relative to the level of DC bias current supplied to the output stage of the amplifier is dynamically adjusted in response to an input signal level at the input stage. In an advantageous embodiment, the total power consumption of the transducer amplifier is maintained at an essentially constant level to comply with the fixed power budget. The dynamic adjustment of DC bias provides performance improvement in the transducer amplifier because the DC bias current in the input stage can be reduced under large transducer signal conditions without audible noise degradation of the amplified transducer signal due to perceptual masking. At the same time, increasing the DC bias current, and therefore power consumption, of the output stage, under large signal conditions improves the load handling capability which is required to provide appropriate output voltage and current for the load.

PRIOR ART

U.S. Pat. No. 6,175,279 discloses a low-noise-amplifier (LNA) for RF signals with an adjustable bias current source. The bias current can be adjusted continuously or in discrete steps. The bias current adjustment is performed to adapt linearity and noise performance of the LNA to actual RF reception conditions. A high bias current is set in hostile RF environments, for example with a high level of spurious RF signals, and a lower bias current is set in benign RF environments.

GB239305 discloses a low-noise-amplifier (LNA) for RF signals with an adjustable bias current source. The bias current of the LNA is responsive to a control signal to "provide the optimum DC bias current needed for minimum power consumption consistent with the appropriate dynamic range". The control signal is derived from a signal quality measure of the incoming RF signal.

SUMMARY OF INVENTION

According to a first aspect of the invention, there is provided an amplifier, comprising an input stage adapted to receive and amplify or buffer an input signal and biased with a first DC bias current. An output stage of the amplifier is adapted to supply an output signal to an amplifier load and biased with a second DC bias current. An adjustable bias current generator is operatively coupled to the input stage and the output stage to supply these with the first and second DC bias currents, respectively. A level detector is operatively coupled to the input signal and the adjustable bias current generator to control levels of the first and second DC bias currents in dependence of a level of the input signal. The adjustable bias current generator adjusts the respective levels of first and second DC bias currents in opposite directions.

The amplifier may comprise one or more intermediate amplification, buffering, or frequency shaping stages connected in-between the input and output stage. These intermediate amplification, buffering, or frequency shaping stages may operate with a substantially fixed DC bias current independent of the level of the input signal. In other embodiments of the invention, the input stage and output stage may be directly interconnected by appropriate electrical wiring.

The dynamic adjustment of the first and second DC bias currents provides performance improvement in the amplifier because the level of the first DC bias current supplied to the input stage can be reduced under large input signal conditions without audible degradation of the amplified input signal due to perceptual masking of increased thermal noise of the input stage. At the same time, load handling capability of the output stage is improved by the increasing level of the second DC bias current to provide adequate levels of output voltage and current for the amplifier load under large signal conditions.

In an advantageous embodiment of the invention, a sum of the levels of the first and second DC bias currents remains substantially constant independent of the level of the input signal. This allows the amplifier to exploit the previously-mentioned advantages related to the dynamic adjustment of the first and second DC bias currents while keeping a total DC bias current or power consumption of the amplifier at an essentially constant level independent of the level of the input signal so as to comply with a fixed power budget. According to this embodiment of the invention, the sum of the first and second DC bias currents varies less than +/−10%, or more preferably less than +/−5% such as below +/−2% for all input signal levels in an operating range of the amplifier.

The sum of the levels of the first and second DC bias currents may lie between 50 µA and 10 µA, but preferably between 50 µA and 500 µA. A total DC bias current of the amplifier may be larger if the amplifier comprises one or more of the previously-mentioned intermediate amplification, buffering, or frequency shaping stages connected in-between the input and output stage.

The level of input signal may be represented in various formats such as average signal level, RMS signal level or peak signal level. In certain embodiments of the invention, a sense input of the level detector may be coupled directly to the input signal of the input stage. In other embodiments the input signal is detected in an indirect manner for example by coupling the sense input of the level detector to an intermediate signal node or to the output signal or to any other appropriate signal node of the amplifier carrying a signal voltage representative of the level of the input signal.

The input stage may comprise a single-ended or differential amplifier based on MOS transistor(s) or bipolar transistor or a mix of both. The amplifier may be integrated on a single semiconductor substrate—for example in the form of a CMOS or BiCMOS Application Specific Integrated Circuit to provide a very compact amplifier solution which can be manufactured in large quantities at low cost. The input stage preferably comprises a sub-micron PMOS or NMOS transistor having a gate terminal operatively coupled to the input signal. Due to their low flicker-noise sub-micron PMOS transistors are particularly advantageous for audio amplifiers, such as low-power microphone preamplifiers or speaker amplifiers for miniature electroacoustic transducers.

In a number of embodiments of the present amplifier, it may be beneficial to provide a certain range of the input signal level where the first and/or second DC bias currents are kept essentially constant despite the oppositely oriented dynamic DC bias current adjustment. The range may be created by setting a minimum signal threshold for the input signal level so that input signals falling below this minimum signal threshold result in a constant level of the first DC bias current and a constant level of the second DC bias current. This may prevent the level of the first DC bias current from increasing to an inappropriately large value and the second DC bias current from dropping to zero under this condition. Consequently, introducing the minimum signal threshold for the input signal level prevents that output transistor(s) of the output stage are forced into a highly non-linear cut-off region. The range may in addition comprise a maximum signal threshold so that input signals above this maximum signal threshold result in a constant level of the first DC bias current and a constant level of the second DC bias current. This prevents the level of the second DC bias current from increasing to an inappropriately large value with the level of the first DC bias current dropping to zero and forcing input transistor (s) of the input stage into a highly non-linear cut-off region.

In one embodiment of the invention, the first DC bias current decreases in level and the second DC bias current increases in level with increasing level of the input signal from the minimum signal threshold to the maximum signal threshold and vice versa for a decreasing level of the input signal. The minimum and maximum signal thresholds may conveniently be created by adapting the adjustable bias current generator to set a fixed minimum level of the second DC bias current and a fixed minimum level of the first DC bias current.

The actual values of the maximum and minimum signal thresholds may vary widely depending on a specific application. In a microphone preamplifier, the fixed minimum level of the second DC bias current may correspond to an input signal level of less than 1 mV RMS, or more preferably less than 0.5 mV RMS such as less than 100 µV RMS.

The level detector may comprise an attack time constant and/or a release time constant controlling respective rates of change over time of the first DC bias current and the second DC bias current. The inclusion of an attack time constant, for example between 1 millisecond and 20 milliseconds, and/or a release time constant, for example between 10 milliseconds and 2000 milliseconds can be highly beneficial for audio amplifiers to avoid creating audible transient spikes or clicks in an audio signal by making abrupt changes to the first and/or second DC bias currents.

According to a particularly advantageous embodiment of the invention, the amplifier comprises a feedback loop around the input stage and the output stage. The feedback loop stabilizes a small-signal or AC gain of the amplifier so as to maintain it substantially constant independent of the respective levels of the first and second DC bias currents. This ensures that the small-signal gain in an intended pass-band of the amplifier remains substantially constant despite a varying small signal gain in the input stage or a varying gain in the output stage caused by the changing levels of the first and second DC bias currents. The other well-known amplifier benefits associated with negative feedback remain fully operative such as improved frequency response and linearity and insensitivity to tolerances on semiconductors and passive electronic components.

A second aspect of the present invention relates to an electroacoustical transducer comprising an integrated semiconductor circuit comprising an amplifier according to any of the above-disclosed amplifier embodiments. A signal terminal of the electroacoustical transducer is operatively connected to the input stage or the output stage of the amplifier. The electroacoustical transducer may comprise a condenser transducer element of a condenser microphone. In another embodiment of the invention, a speaker or receiver, for example a miniature dynamic speaker for portable terminals, is coupled to the output stage for sound generation.

BRIEF DESCRIPTION OF THE DRAWINGS

A preferred embodiment of the invention will be described in more detail in connection with the appended drawings in which.

DESCRIPTION OF PREFERRED EMBODIMENTS

Figure 1:
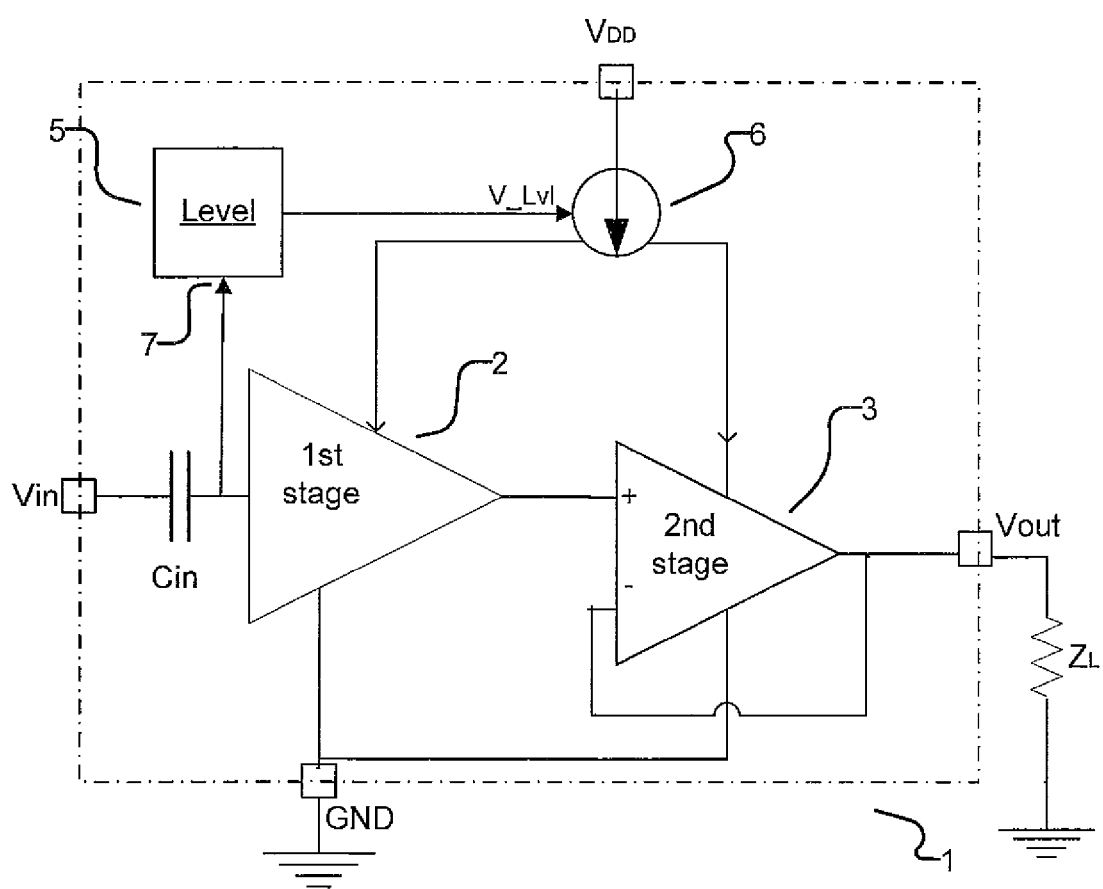
FIG. 1 is a schematic drawing of an integrated circuit microphone preamplifier according to a preferred embodiment of the invention.

FIG. 1 shows a transducer amplifier 1 in form of an integrated circuit microphone preamplifier. The integrated circuit microphone preamplifier 1 or microphone preamplifier comprises an input stage 2, indicated as $1^{st}$ stage, operatively connectable to an transducer signal terminal of an electroacoustical transducer (not shown), such as a miniature condenser microphone for mobile terminals, through microphone input terminal, Vin. A coupling capacitor Cin is coupled between the microphone input terminal and the input stage 2 to provide DC separation there between. In one embodiment of the invention the input stage has an input impedance larger than 10 GΩ, such as larger than 100 GΩ in order to match a very large generator impedance of the miniature condenser microphone so as to minimize attenuation of a transducer signal generated by the miniature condenser microphone. This latter generator impedance may correspond to a capacitor with a value between 0.5-2 pF. The input stage 2 may comprise a single-ended or differential amplifier based on MOS transistor(s), preferably in form of PMOS transistor(s) to minimize flicker noise. The input stage 2 transmits an amplified or buffered transducer signal to an output stage, indicated as $2^{nd}$ stage, which in turn supplies an amplified output signal to an externally accessible terminal, Vout. An adjustable bias current generator or source 6 has a control input, V_lvl, and two current outlets that supply respective DC bias currents to the input stage 2 and the output stage 3 through indicated interconnecting wires.

The control input V_lvl of the adjustable bias current generator 6 steers respective levels of the DC bias currents to the input stage 2 and the output stage 3 in opposite directions in a manner where an increasing level of DC bias current to the input stage 2 leads to a decreasing level of the DC bias current supplied to the output stage 2 and vice versa. In the present microphone preamplifier 1, the sum of the two DC bias currents remains essentially constant, preferably within +/−5%, or more preferably within +/−2%, across a nominal signal range of the input signal on terminal Vin. However, in other embodiments of the invention the sum of the two DC bias currents may vary. A voltage control signal, representative of a level of the transducer signal provided on the microphone input terminal, Vin, is determined by a level detector 5 and routed to the control input L_lvl of the adjustable bias generator 6. A level of this voltage control signals sets the respective levels of the two DC bias currents as explained in detail in connection with FIG. 2 below.

Even though the levels of the DC bias currents to the input stage 2 and the output stage 3 in are steered in opposite directions, the present embodiment of the invention comprises a minimum signal threshold. When the transducer signal drops below this minimum signal threshold, the DC bias current in the output stage 3 is maintained at constant level. This feature prevents the DC bias current of the output stage 3 from dropping all the way to zero potentially forcing an output transistor or transistor pair into cut-off states. Such cut-off states could lead to objectionable cross-over distortion at very low transducer signal levels. Likewise, a maximum signal threshold ensures that the DC bias current supplied to the input stage 2 has a fixed minimum value preventing the input stage DC bias current from dropping to zero at very large levels of the transducer signal so as to drive input transistor or transistors of the input stage 2 into a cut-off state.

In the present embodiment of the invention, a load impedance, $Z_L$, is coupled to the output stage 3 through the Vout terminal indicating the output voltage to be supplied to a device external to the present microphone preamplifier 1. As illustrated on FIG. 3, the Vout terminal is an externally accessible terminal of a miniature microphone 30 in the present embodiment of the invention. In other embodiments, the Vout terminal serves as an intermediate circuit node inside a larger microphone amplifier assembly and coupling to additional integrated circuit blocks arranged on the larger microphone amplifier. The additional integrated circuit blocks may for example comprise an A/D converter in a digital microphone amplifier assembly and the indicated load impedance, $Z_L$, representing an input impedance of the A/D converter.

As previously mentioned, the level detector 5 determines the level of the transducer signal provided on the microphone input terminal, Vin, and generates the voltage control signal, V_lvl, transmitted to the control input of the adjustable bias generator 6. The level of the transducer signal may be represented in various formats such as average signal level, RMS signal level or peak signal level. The level of the transducer signal is preferably determined with an attack time constant and a release time constant. These may differ in value. The attack time is preferably between 1 and 20 milliseconds and the release time between 20 and 500 milliseconds. Time constants associated with the attack and release time constants may be generated by respective continuous time RC circuits or discrete time circuits such as switched capacitor networks.

In the present embodiment of the invention, a sense input 7 of the level detector 5 is coupled directly to an input of the input stage 2 to detect the level of the transducer signal, but the level of the transducer signal may alternatively be detected in an indirect manner for example by coupling the sense input 7 to an output node of the input stage or the Vout terminal or to any other appropriate signal node of the microphone preamplifier 1 carrying a signal voltage representative of the level of the transducer signal.

In an exemplary embodiment of the microphone preamplifier 1, the total DC bias current to the input stage 2 and output stage 3 is maintained substantially constant at 125 µA independently of the level of the transducer signal to meet an available power budget. At transducer signal levels below the minimum signal threshold, the DC bias current of the input stage 2 is set to 100 µA and the DC bias current of the output stage 3 accordingly set to 25 µA. At transducer signal levels on and above the maximum signal threshold, the DC bias current of the input stage 2 is kept constant at 25 µA and the DC bias current of the output stage 3 is accordingly kept constant at 100 µA. In a region of transducer signal levels in-between these minimum and maximum signal thresholds, the respective levels of the DC bias currents are adjusted in opposite directions in accordance with a control function set by characteristics of the level detector and the adjustable bias current generator. In this embodiment of the invention, the minimum and maximum signal thresholds may correspond to sound pressure levels of the miniature condenser microphone on 40 and 100 dB SPL, respectively.

Figure 2:
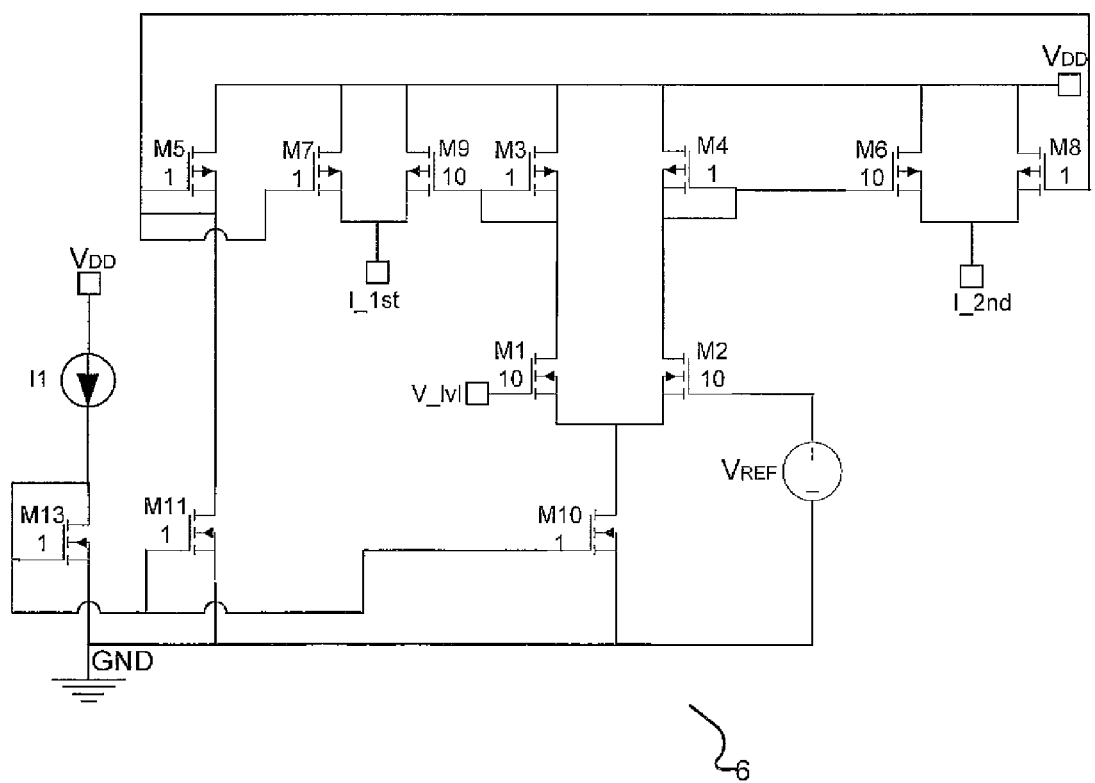
FIG. 2 is a schematic drawing of an adjustable DC bias current generator for the integrated circuit microphone preamplifier depicted in FIG. 1.

FIG. 2 is a transistor level schematic of the adjustable bias current generator 6 schematically depicted on FIG. 1 in a preferred implementation. The adjustable bias current generator 6 or bias generator comprises the previously-mentioned control input indicated by V_lvl configured to receive the control signal supplied by the level detector 5. The bias generator 6 is adapted to steer respective levels of the DC bias currents to the input stage 2 and the output stage 3 in opposite directions so that an increasing level of DC bias current to the input stage 2 leads to a decreasing level of the DC bias current supplied to the output stage 3 and vice versa. Varying DC bias current levels for the input stage 2 and output stage 3 are supplied through indicated current outlets 1__1st and 1__2nd, respectively. Internal operation of the bias generator is as follows: The level of the control signal supplied to the control input V_lvl is compared to a reference DC voltage $V_{REF}$ in a differential amplifier formed by M1, M2, M10, M3 and M4. If the control signal is equal to $V_{REF}$ a bias current of M3 is substantially equal to a bias current in M4. Since M4 and M3 are both coupled as PMOS diodes and have identical size, as indicated by symbols 1 that represent relative Width/Length ratios between depicted MOS transistors, voltage drops across these diodes are identical leading to identical gate voltages on current mirror coupled PMOS transistors M6 and M9. This leads to a corresponding, but ten times larger (due to the indicated transistor size ratios), increase in supply of output current through current outlets 1_1st and 1_2nd from drain terminals of M6 and M9, respectively.

Output current through current outlets 1_1st and 1_2nd additionally comprises respective current contributions from PMOS transistor M8 and M7, but these contributions are identical as well since PMOS transistors M8 and M7 have identical size and both are coupled in parallel as current mirrors to M5. Accordingly, for the condition $V\_lvl=V_{REF}$ the level of the DC bias current to the input stage 2 is identical to the level of the DC bias current to the output stage 3 assuming ideal matching of all relevant MOS transistors. By choosing a proper DC voltage for $V_{REF}$ this operating point for the bias generator 6 can be placed at any desired transducer voltage and corresponding sound pressure level.

A DC bias source for the bias generator 6 is illustrated in schematic form as 11 coupled between NMOS transistor M13 and a DC supply voltage $V_{DD}$ of the bias generator. Current mirror coupled NMOS transistor M10 serves to bias the differential amplifier with an essentially constant bias current. When the voltage on the control input V_lvl decreases from the above-mentioned operating point, it may either indicate an increasing transducer voltage or a decreasing transducer voltage determined by design details of the level detector 5. In the present situation, the level detector 5 has been designed so that a decreasing voltage on the control input V_lvl represents an increasing transducer voltage which, according to the present design objective, shall lead to increasing current to the second stage 3 to improve load drive capability under large output signal conditions. This has been accomplished because the respective currents through PMOS transistors M4, M6 and outlet terminal 1_2nd increase in a substantially proportional manner for a decreasing voltage supplied on the control input V_lvl. A fixed contribution to the DC bias current of the output stage 3 is supplied through outlet terminal 1_2nd by PMOS transistor M8. This fixed contribution is independent of the level of the transducer signal due to the illustrated mirrored coupling of M8 and M5. Consequently, this fixed contribution of current ensures the DC bias current of the output stage 3 is maintained at a constant level and never drops to zero for small transducer signals below the minimum signal threshold where the current through M6 may drop to zero.

Increasing voltage on the control input V_lvl from the above-mentioned operating point corresponds to decreasing transducer voltage. The decreasing transducer voltage shall, according to the present design objective, lead to the supply of increasing DC bias current to the first stage 2 through current outlet 1_1st and a corresponding decrease in DC bias current to the second stage 3 so as to improve noise performance of the input stage and the microphone preamplifier 1 as a whole under operating conditions with limited need for output drive capability of the output stage 3. This functionality is immediately apparent from inspection of the transistor level diagram of the bias generator 6 due to the symmetry of the previously-mentioned differential amplifier and the current mirror coupling between M3 and M9 that is equivalent to the previously-explained mirror coupling between M4 and M6.

Figure 3:
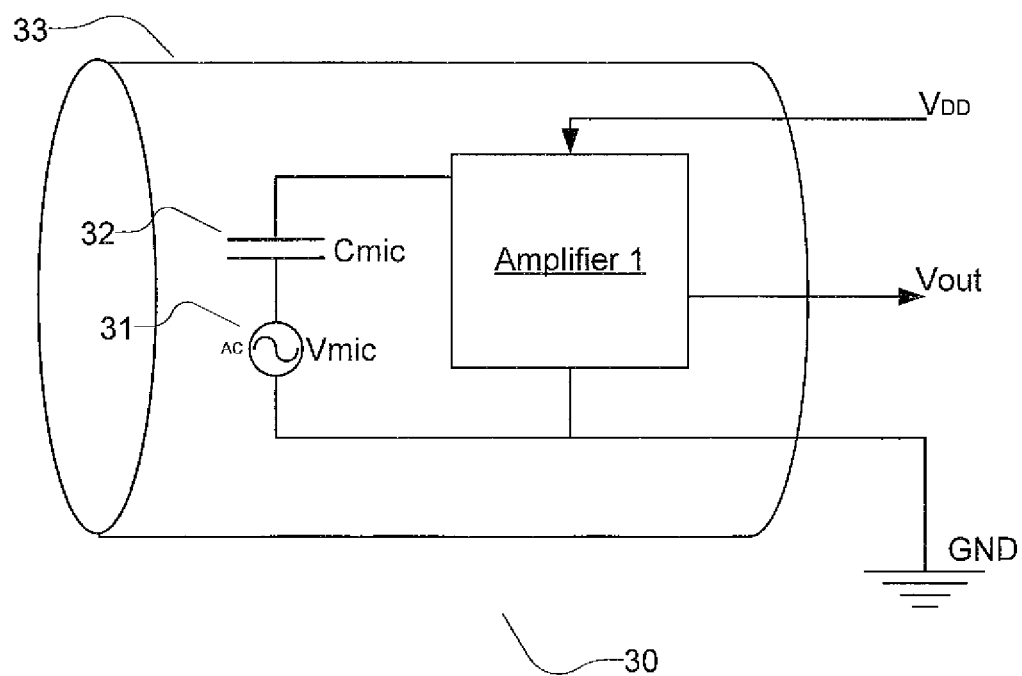
FIG. 3 is a schematic drawing of a miniature condenser microphone comprising the integrated circuit microphone preamplifier depicted in FIG. 1.

FIG. 3 is a schematic drawing of a miniature condenser microphone 30 comprising the integrated circuit microphone preamplifier 1 depicted in FIGS. 1 and 2 according to a preferred embodiment of the invention. The miniature condenser microphone 30 is sized and shaped to mobile terminal applications. The miniature microphone may have a cylindrical housing contour as illustrated with a diameter between 3 and 10 mm. The miniature condenser microphone 30 comprises a metallic housing 33 surrounding a condenser microphone transducer element schematically illustrated by an equivalent generator impedance in the form of capacitance Cmic and an equivalent open-circuit voltage generator in the form of Vmic. Vmic corresponds to the open-circuit signal voltage generated by the condenser microphone transducer element when subjected to sound in the audible range from about 20 Hz to 20 kHz. The condenser microphone transducer element comprises a displaceable diaphragm adjacently positioned to a perforated back plate structure to form essentially parallel plates of a capacitor structure with an intermediary electrical field generated by a DC bias voltage source. The condenser microphone transducer element may comprise a microelectromechanical (MEMS) transducer element or a conventional condenser transducer element.

An output terminal Vout provides an amplified microphone signal to external devices, while a power supply or DC supply voltage on externally accessible terminal $V_{DD}$ supplies power the integrated circuit microphone preamplifier 1. As previously-mentioned, the capacitance Cmic may correspond to a very small capacitor with a value between 0.5-2 pF making the interface to the microphone input terminal, Vin, very fragile and sensitive to interference from electromagnetic noise. An exemplary embodiment of the miniature condenser microphone 30 has an electroacoustical sensitivity of around 1 mV for a sound pressure level of 74 dB SPL at 1 kHz.

The invention claimed is:

1. An amplifier, comprising:
   a first amplifier for receiving and amplifying or buffering an input signal, wherein the first amplifier is biased with a first DC bias current;
   a second amplifier for supplying an output signal to an amplifier load, wherein the second amplifier is biased with a second DC bias current;
   an adjustable bias current generator operatively coupled to the first amplifier and the second amplifier to supply these with the first and second DC bias currents, respectively; and
   a level detector operatively coupled to the input signal and the adjustable bias current generator to control levels of the first and second DC bias currents in response to a level of the input signal;
   wherein the adjustable bias current generator adjusts the respective levels of the first and second DC bias currents in opposite directions.

2. The amplifier according to claim 1, wherein a sum of the levels of the first and second DC bias currents remains substantially constant independent of the level of the input signal.

3. The amplifier according to claim 1, wherein the first DC bias current decreases in level and the second DC bias current increases in level with increasing level of the input signal from a minimum signal threshold to a maximum signal threshold and vice versa for a decreasing level of the input signal.

4. The amplifier according to claim 3, wherein the adjustable bias current generator sets a fixed minimum current of the second DC bias current and/or a fixed minimum current of the first DC bias current.

5. The amplifier according to claim 4, wherein the fixed minimum current of the second DC bias current corresponds to an input signal level of less than 1 mV RMS, or more preferably less than 0.5 mV RMS such as less than 100 μV RMS.

6. The amplifier according to claim 1, wherein the level detector comprises an attack time constant and/or a release time constant controlling respective rates of change in time of the first DC bias current and the second DC bias current.

7. The amplifier according to claim 1, wherein a sum of the levels of the first and second DC bias currents lies between 50 µA and 10 mA, preferably between 50 µA and 500 µA for a nominal level of the input signal.

8. The amplifier of claim 1, wherein the first amplifier comprises a sub-micron PMOS or NMOS transistor having a gate terminal operatively coupled to the input signal.

9. The amplifier according to claim 1, comprising a feedback loop around the first amplifier and the second amplifier.

10. The amplifier according to claim 1, wherein the first amplifier is operable to generate a first biased output coupled to an input of the second amplifier.

11. The amplifier according to claim 10, wherein the first DC bias current causes biasing of the first biased output.

12. An electroacoustical transducer comprising:
   an integrated semiconductor circuit comprising an amplifier, the amplifier comprising:
      a first amplifier for receiving and amplifying or buffering an input signal, wherein the input stage is biased with a first DC bias current;
      a second amplifier for supplying an output signal to an amplifier load, wherein the second amplifier is biased with a second DC bias current;
   an adjustable bias current generator operatively coupled to the first amplifier and the second amplifier to supply these with the first and second DC bias currents, respectively; and
      a level detector operatively coupled to the input signal and the adjustable bias current generator to control levels of the first and second DC bias currents in response to a level of the input signal, wherein the adjustable bias current adjusts the respective levels of first and second DC bias currents in opposing directions; and
      a signal terminal of the electroacoustical transducer operatively connected to the first amplifier or the second amplifier of the amplifier.

13. The electroacoustical transducer according to claim 12, comprising a condenser microphone transducer element.

* * * * *